(12) United States Patent
Akamatsu et al.

(10) Patent No.: US 9,472,527 B2
(45) Date of Patent: Oct. 18, 2016

(54) SEMICONDUCTOR DEVICE AND MANUFACTURING METHOD THEREOF

(71) Applicant: FUJITSU LIMITED, Kawasaki-shi, Kanagawa (JP)

(72) Inventors: Toshiya Akamatsu, Zama (JP); Muneyuki Odaira, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/589,413

(22) Filed: Jan. 5, 2015

(65) Prior Publication Data
US 2015/0221607 A1  Aug. 6, 2015

(30) Foreign Application Priority Data

Feb. 4, 2014 (JP) ................. 2014-019676

(51) Int. Cl.
 *H01L 23/00* (2006.01)
 *H01L 23/498* (2006.01)
 *H01L 21/48* (2006.01)

(52) U.S. Cl.
 CPC ........... *H01L 24/16* (2013.01); *H01L 21/4853* (2013.01); *H01L 23/49811* (2013.01); *H01L 24/11* (2013.01); *H01L 24/13* (2013.01); *H01L 24/14* (2013.01); *H01L 24/81* (2013.01); *H01L 24/03* (2013.01); *H01L 24/05* (2013.01); *H01L 2224/0345* (2013.01); *H01L 2224/03614* (2013.01); *H01L 2224/03912* (2013.01); *H01L 2224/0401* (2013.01); *H01L 2224/05166* (2013.01); *H01L 2224/05647* (2013.01); *H01L 2224/06102* (2013.01); *H01L 2224/1147* (2013.01); *H01L 2224/11462* (2013.01); *H01L 2224/11901* (2013.01); *H01L 2224/11903* (2013.01); *H01L 2224/131* (2013.01); *H01L 2224/13012* (2013.01); *H01L 2224/13147* (2013.01); *H01L 2224/13565* (2013.01); *H01L 2224/13647* (2013.01); *H01L 2224/1403* (2013.01); *H01L 2224/14051* (2013.01); *H01L 2224/1601* (2013.01); *H01L 2224/16113* (2013.01); *H01L 2224/16227* (2013.01); *H01L 2224/16237* (2013.01); *H01L 2224/8118* (2013.01); *H01L 2224/81141* (2013.01); *H01L 2224/81193* (2013.01); *H01L 2224/81815* (2013.01); *H01L 2924/3511* (2013.01)

(58) Field of Classification Search
 CPC ... H01L 21/56; H01L 21/561; H01L 21/565; H01L 24/32; H01L 24/45; H01L 24/48; H01L 24/49; H01L 24/73; H01L 24/97; H01L 25/0657; H01L 25/0753; H01L 25/105; H01L 25/167
 See application file for complete search history.

(56) References Cited

U.S. PATENT DOCUMENTS 7,939,945 B2 * 5/2011 Sauciuc et al. ........ H05K 3/321
                                                     257/774

FOREIGN PATENT DOCUMENTS

JP        2005-311250       11/2005

* cited by examiner

*Primary Examiner* — Kyoung Lee
(74) *Attorney, Agent, or Firm* — Fujitsu Patent Center

(57) ABSTRACT

Surfaces of a semiconductor chip and a circuit board are made to face each other, and upper portions of stoppers of the circuit board are fit into regions between adjacent stoppers of rail grooves of the semiconductor chip, and upper portions of the stoppers of the semiconductor chip are fit into regions between the adjacent stoppers of rail grooves of the circuit board, whereby side surfaces of first terminals of the semiconductor chip and side surfaces of second terminals of the circuit board are electrically connected.

13 Claims, 19 Drawing Sheets

SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2014-019676, filed on Feb. 4, 2014, the entire contents of which are incorporated herein by reference.

FIELD

The embodiments discussed herein are directed to a semiconductor device and a manufacturing method thereof.

BACKGROUND

When a semiconductor element is electrically connected to a circuit board, there has been conventionally used a method in which pillar-shaped terminals are disposed on an outer peripheral portion of the semiconductor element and an outer peripheral portion of the circuit board and the terminals are connected to each other by a wire bonding method. In recent years, in accordance with an increase of the number of connection terminals of semiconductor elements, there has been used a flip chip connection method of connecting the terminals while making surfaces of the semiconductor element and the circuit board face each other.

In the flip chip connection method, the semiconductor element having a solder applied on tips of its terminals is fixed on a head attachment, and the circuit board facing the semiconductor element is fixed on a stage. Then, by heating the head attachment by using a flip chip bonder, the solder is melted, whereby the upper and lower terminals are electrically connected at their tips. This terminal connection method enables the connection of a larger number of terminals than conventionally to realize performance improvement.

[Patent Document 1] Japanese Laid-open Patent Publication No. 2005-311250

Though enabling the connection of many terminals, the flip chip connection method has come to have the following problems in accordance with the recent progress of the miniaturization of the terminals.

In connecting the miniaturized terminals, mounting precision to the flip chip bonder is very important. Since the tips of the corresponding terminals are connected, there is a concern that, even if their positions are aligned when the tips come into contact with each other, their positions are deviated at the time of pressing and heating. Therefore, it is necessary to strictly set not only the control of the position of the flip chip bonder but also the pressurization control, the heating time, and so on.

The area of the mounted semiconductor element is on an increasing trend and the thickness of the semiconductor element is on a decreasing trend. In this case, a warp occurs in the semiconductor element, and when the semiconductor element is joined to the circuit board, a problem such as a connection failure of the terminals at a center portion of the semiconductor element becomes noticeable even though the terminal connection is achieved on an outer peripheral portion of the semiconductor element.

SUMMARY

One embodiment of a semiconductor device is a semiconductor device including a first electronic component and a second electronic component at least one of which is a semiconductor element, the first electronic component having a first terminal on a surface and the second electronic component having a second terminal on a surface, wherein the surface of the first electronic component and the surface of the second electronic component face each other, and at least part of a side surface of the first terminal and at least part of a side surface of the second terminal are electrically connected.

An embodiment of a manufacturing method of a semiconductor device is a manufacturing method of a semiconductor device including a first electronic component and a second electronic component at least one of which is a semiconductor element, the method including: disposing the first electronic component having a first terminal on a surface and the second electronic component having a second terminal on a surface, with the respective surfaces facing each other; and relatively moving the first electronic component in parallel to the surface of the second electronic component to electrically connect at least part of a side surface of the first terminal and at least part of a side surface of the second terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, various concrete embodiments of a semiconductor device and a manufacturing method thereof will be described in detail with reference to the drawings. In the following various embodiments, as a semiconductor device, one in which a semiconductor element (semiconductor chip) being a first electronic component and a circuit board being a second electronic component are joined by a flip chip connection method will be exemplified. These embodiments are applicable also to a chip-on-chip semiconductor device in which semiconductor elements are joined.

First Embodiment

First, a first embodiment will be described.
[Fabrication of Semiconductor Chip]
In fabricating a semiconductor device according this embodiment, a semiconductor chip being a constituent element of the semiconductor device is first formed.

FIG. 1A to FIG. 3C are schematic cross-sectional views illustrating a manufacturing method of the semiconductor chip being the constituent element of the semiconductor device according to the first embodiment, in order of processes.

Figure 1A:
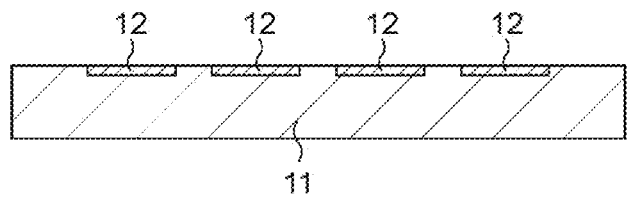
FIG. 1A to FIG. 1F are schematic cross-sectional views illustrating a manufacturing method of a semiconductor chip which is a constituent element of a semiconductor device according to a first embodiment, in order of processes.

To fabricate the semiconductor chip, electrode pads 12 are first formed on a surface of a semiconductor substrate 11 as illustrated in FIG. 1A.

In a surface layer of the semiconductor substrate 11, functional elements such as MOS transistors and semiconductor memories, and so on are formed, and multilayer interconnections electrically connected to the functional elements and so on are formed. On the surface of the semiconductor substrate 11, the electrode pads 12 electrically connected to the multilayer interconnections are formed.

Figure 1B:
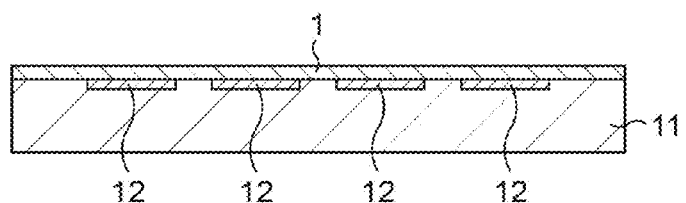

Subsequently, as illustrated in FIG. 1B, a resist 1 is applied and formed on the surface of the semiconductor substrate 11.

Figure 1C:
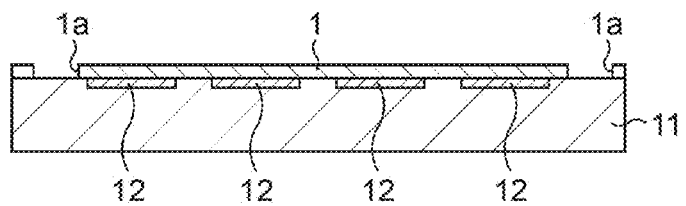

Subsequently, as illustrated in FIG. 1C, openings 1a are formed in the resist 1.

In detail, by processing the resist 1 by lithography, the pair of openings 1a from which predetermined rail groove formation regions of the surface of the semiconductor substrate 11 are exposed are formed.

Figure 1D:
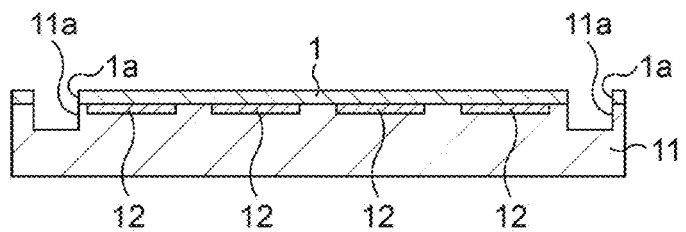

Subsequently as illustrated in FIG. 1D, rail grooves 11a are formed on the semiconductor substrate 11.

In detail, the semiconductor substrate 11 is dry-etched by using the resist 1 as a mask. As etching gas, mixed gas of $SF_6$ and $C_4H_8$ is used, for instance. Consequently, the pair of rail grooves 11a are formed on the both end regions of the surface of the semiconductor substrate 11.

In the rail grooves 11a formed by the etching, insulating films of $SiO_2$ or the like is desirably formed by, for example, low-temperature CVD or the like.

Figure 1E:
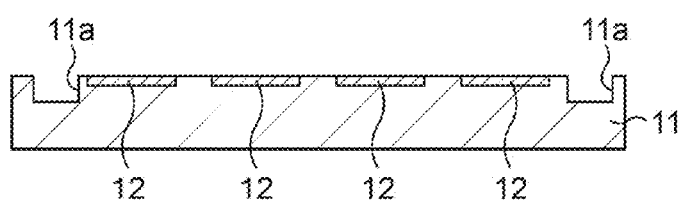

Subsequently, as illustrated in FIG. 1E, the resist 1 is removed by ashing using oxygen plasma or by wet etching using a predetermined chemical solution.

Figure 1F:
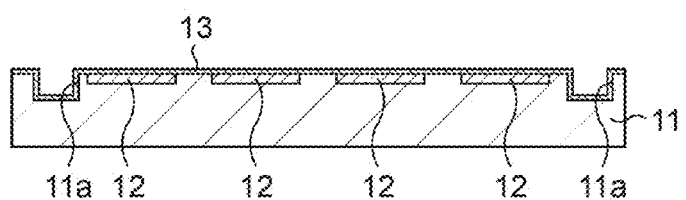

Subsequently, as illustrated in FIG. 1F, a plating seed layer 13 is formed on the surface of the semiconductor substrate 11.

In detail, on the surface of the semiconductor substrate 11 including inner wall surfaces of the rail grooves 11a, Ti/Cu (Ti is a lower layer and Cu is an upper layer) are thinly deposited by, for example, a sputtering method. Consequently, the plating seed layer 13 which serves as a seed of Cu plating is formed.

Figure 2A:
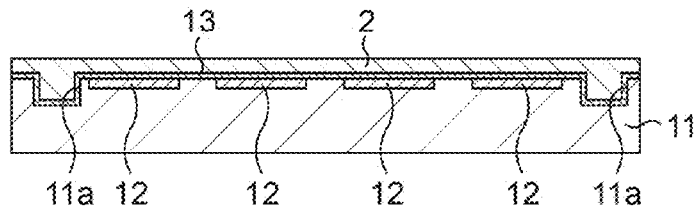
FIG. 2A to FIG. 2F, which continue from FIG. 1F, are schematic cross-sectional views illustrating the manufacturing method of the semiconductor chip which is the constituent element of the semiconductor device according to the first embodiment, in order of processes.

Subsequently, as illustrated in FIG. 2A, a resist 2 is formed on the semiconductor substrate 11.

In detail, the resist 2 is applied and formed so as cover a surface of the plating seed layer 13 on the semiconductor substrate 11.

Figure 2B:
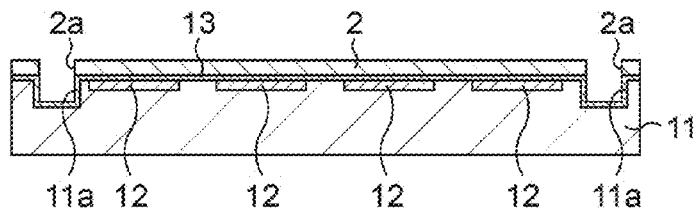

Subsequently, as illustrated in FIG. 2B, openings 2a are formed in the resist 2.

In detail, by processing the resist 2 by lithography, the plural openings 2a from which portions, of the plating seed layer 13, on predetermined stopper formation regions in the rail grooves 11a are exposed are formed.

Figure 2C:
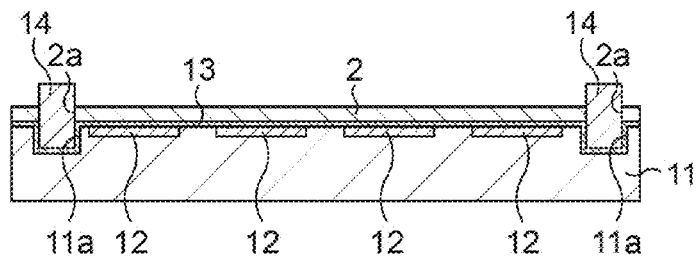

Subsequently, as illustrated in FIG. 2C, a plurality of stoppers 14 are formed in each of the rail grooves 11a.

In detail, by an electrolytic plating method, Cu is deposited on the portions, of the plating seed layer 13, which are in the rail grooves 11a and are exposed from the openings 2a of the resist 2. This Cu is deposited so as to locally fill the rail grooves 11a via the plating seed layer 13 to project upward from the openings 2a. Through the above processes, the plural stoppers 14 are formed in each of the rail grooves 11a. The stoppers 14 are arranged at, for example, equal intervals and are each formed in a block shape whose lower portion is buried in the rail groove 11a and whose upper portion projects from the rail groove 11a.

Figure 2D:
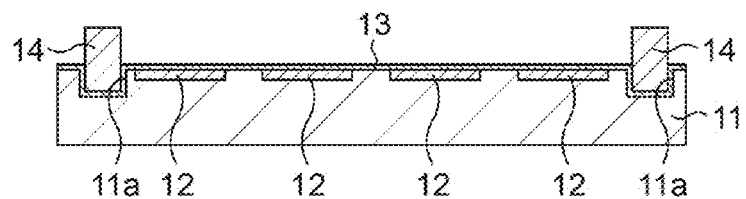

Subsequently, as illustrated in FIG. 2D, the resist 2 is removed by ashing using oxygen plasma or by wet etching using a predetermined chemical solution.

Figure 2E:
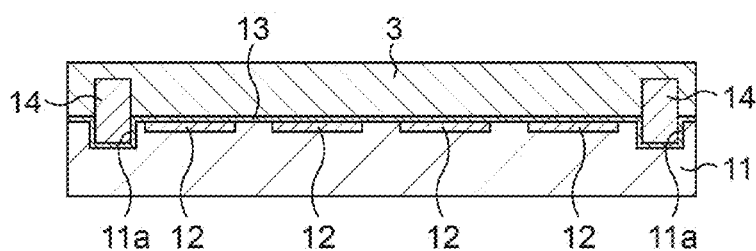

Subsequently, as illustrated in FIG. 2E, a resist 3 is formed on the semiconductor substrate 11.

In detail, the resist 3 is applied and formed on the semiconductor substrate 11 so as to have a thickness large enough to bury the stoppers 14.

Figure 2F:
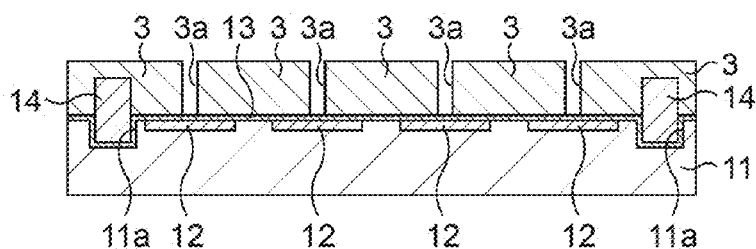

Subsequently, as illustrated in FIG. 2F, openings 3a are formed in the resist 3.

In detail, by processing the resist 3 by lithography, the plural hole-shaped openings 3a from which portions, of the plating seed layer 13, on predetermined connection terminal formation regions on the electrode pads 12 are exposed are formed.

Figure 3A:
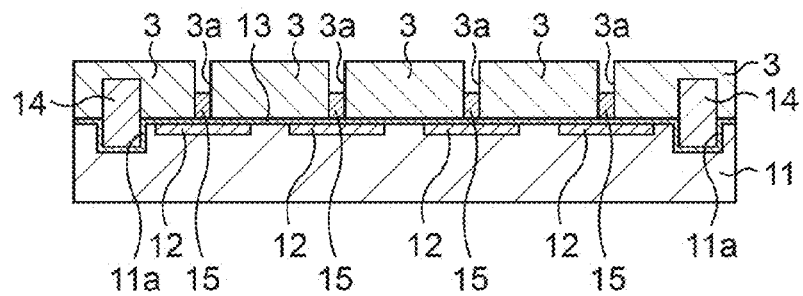
FIG. 3A to FIG. 3C, which continue from FIG. 2F, are schematic cross-sectional views illustrating the manufacturing method of the semiconductor chip which is the constituent element of the semiconductor device according to the first embodiment, in order of processes.

Subsequently, as illustrated in FIG. 3A, first terminals 15 are formed on the electrode pads 12.

In detail, by an electrolytic plating method, Cu is deposited on the portions, of the plating seed layer 13, which are on the electrode pads 12 and are exposed from bottom portions of the openings 3a, so as to partly fill the openings 3a of the resist 3. Consequently, the pillar-shaped first terminals 15 are formed on the electrode pads 12.

Figure 3B:
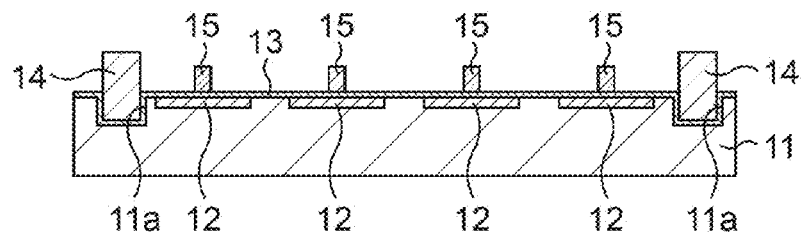

Subsequently, as illustrated in FIG. 3B, the resist 3 is removed by ashing using oxygen plasma or by wet etching using a predetermined chemical solution.

Figure 3C:
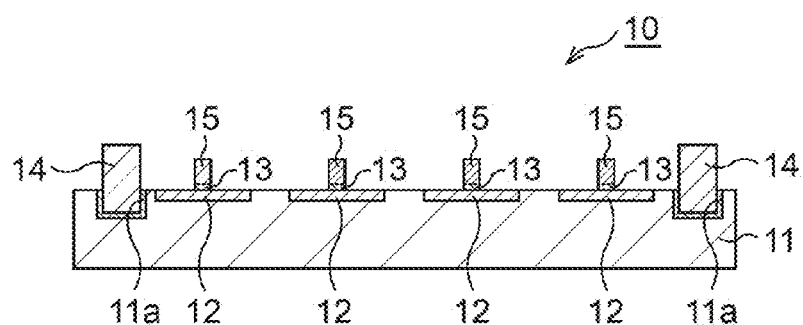

Subsequently, as illustrated in FIG. 3C, exposed portions of the plating seed layer 13 are removed.

In detail, unnecessary portions, of the plating seed layer 13, which are exposed between the first terminals 15 are removed by wet etching.

Through the above processes, the semiconductor chip 10 is formed.

[Fabrication of Circuit Board]

A circuit board being a constituent element of the semiconductor device is formed.

FIG. 4A to FIG. 7C are schematic cross-sectional views illustrating a manufacturing method of the circuit board being the constituent element of the semiconductor device according to the first embodiment, in order of processes.

Figure 4A:
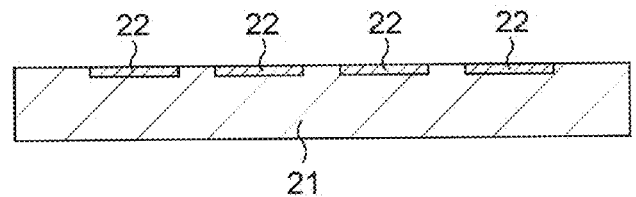
FIG. 4A to FIG. 4F are schematic cross-sectional views illustrating a manufacturing method of a circuit board which is a constituent element of the semiconductor device according to the first embodiment, in order of processes.

To fabricate the circuit board, electrode pads 22 are first formed on a surface of a package substrate 21 as illustrated in FIG. 4A.

Multilayer interconnections and so on are formed in the package substrate 21. On the surface of the package substrate 21, the electrode pads 22 electrically connected to the multilayer interconnections are formed.

Figure 4B:
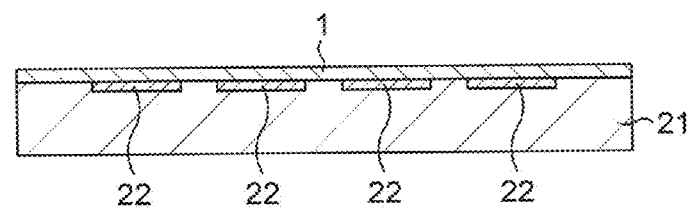

Subsequently, as illustrated in FIG. 4B, a resist 1 is applied and formed on the surface of the package substrate 21.

Figure 4C:
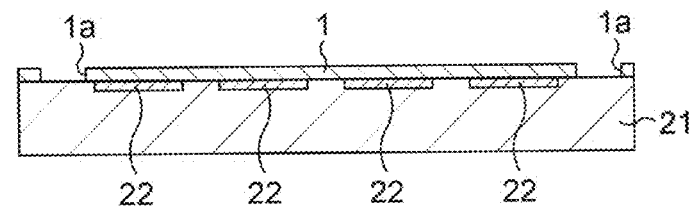

Subsequently, as illustrated in FIG. 4C, openings 1a are formed in the resist 1.

In detail, by processing the resist 1 by lithography, the pair of openings 1a from which predetermined rail groove formation regions of the surface of the package substrate 21 are exposed are formed.

Figure 4D:
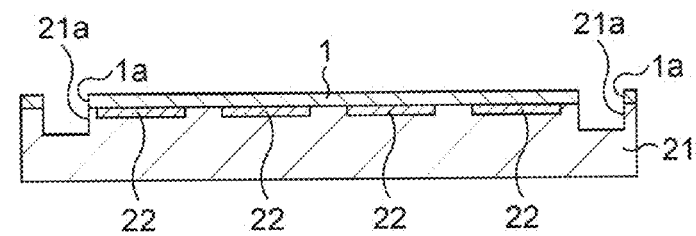

Subsequently, as illustrated in FIG. 4D, rail grooves 21a are formed in the package substrate 21.

In detail, the package substrate 21 is etched by using the resist 1 as a mask. Consequently, the pair of rail grooves 21a are formed in the both end regions of the surface of the package substrate 21.

In the rail grooves 21a formed by the etching, insulating films of $SiO_2$ or the like are desirably formed by, for example, low-temperature CVD or the like.

Figure 4E:
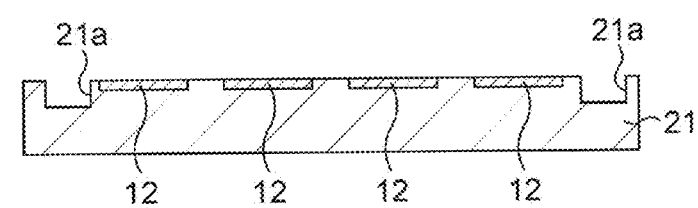

Subsequently, as illustrated in FIG. 4E, the resist 1 is removed by ashing using oxygen plasma or by wet etching using a predetermined chemical solution.

Figure 4F:
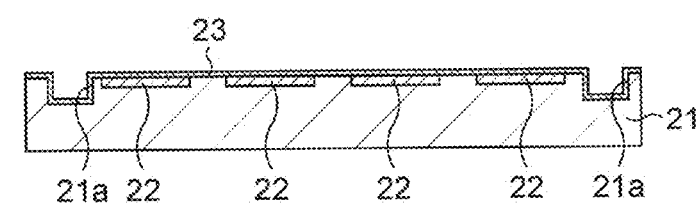

Subsequently, as illustrated in FIG. 4F, a plating seed layer 23 is formed on the surface of the package substrate 21.

In detail, on the surface of the package substrate 21 including inner wall surfaces of the rail grooves 21a, Ti/Cu (Ti is a lower layer and Cu is an upper layer) are thinly deposited by, for example, a sputtering method. Consequently, the plating seed layer 23 which serves as a seed of Cu plating is formed.

Figure 5A:
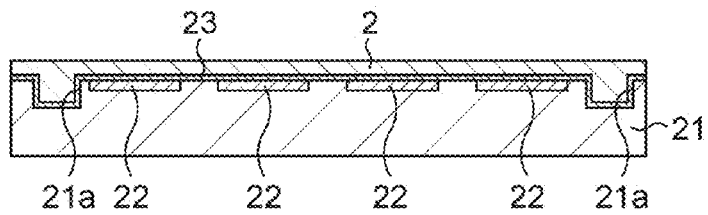
FIG. 5A to FIG. 5F, which continue from FIG. 4F, are schematic cross-sectional views illustrating the manufacturing method of the circuit board which is the constituent element of the semiconductor device according to the first embodiment, in order of processes.

Subsequently, as illustrated in FIG. 5A, a resist 2 is formed on the package substrate 21.

In detail, the resist 2 is applied and formed so as cover a surface of the plating seed layer 23 on the package substrate 21.

Figure 5B:
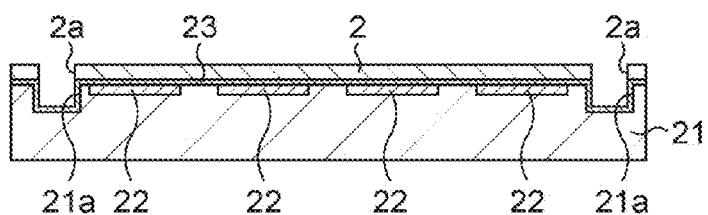

Subsequently, as illustrated in FIG. 5B, openings 2a are formed in the resist 2.

In detail, by processing the resist 2 by lithography, the plural openings 2a from which portions, of the plating seed layer 23, which are on predetermined stopper formation regions in the rail grooves 11a are exposed are formed.

Figure 5C:
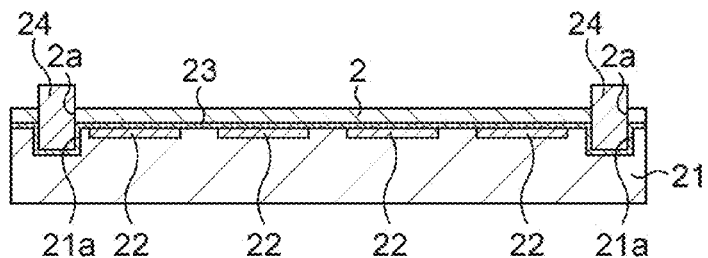

Subsequently, as illustrated in FIG. 5C, a plurality of stoppers 24 are formed in each of the rail grooves 21a.

In detail, by an electrolytic plating method, Cu is deposited on the portions, of the plating seed layer 23, which are in the rail grooves 21a and are exposed from the openings 2a of the resist 2. This Cu is deposited so as to locally fill the rail grooves 21a via the plating seed layer 23 and to project upward from the openings 2a. Through the above processes, the plural stoppers 24 are formed in each of the rail grooves 21a. The stoppers 24 are arranged at, for example, equal intervals and are each formed in a block shape whose lower portion is buried in the rail groove 21a and whose upper portion projects from the rail groove 21a.

Figure 5D:
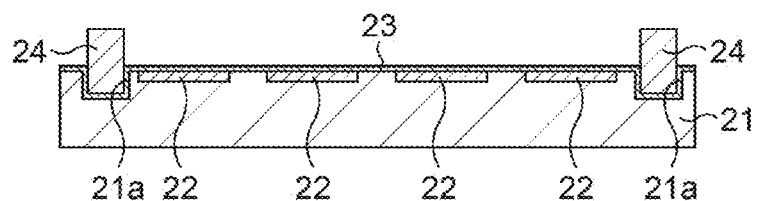

Subsequently, as illustrated in FIG. 5D, the resist 2 is removed by ashing using oxygen plasma or by wet etching using a predetermined chemical solution.

Figure 5E:
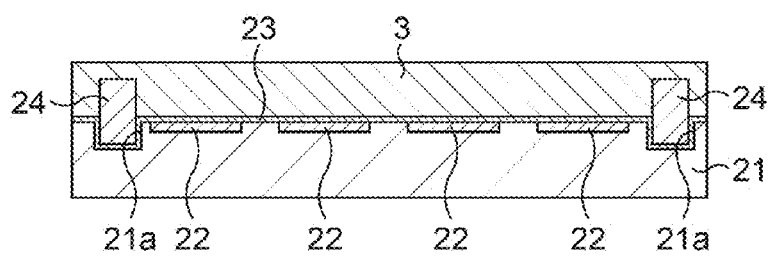

Subsequently, as illustrated in FIG. 5E, a resist 3 is formed on the package substrate 21.

In detail, the resist 3 is applied and formed on the package substrate 21 so as to have a thickness large enough to bury the stoppers 14.

Figure 5F:
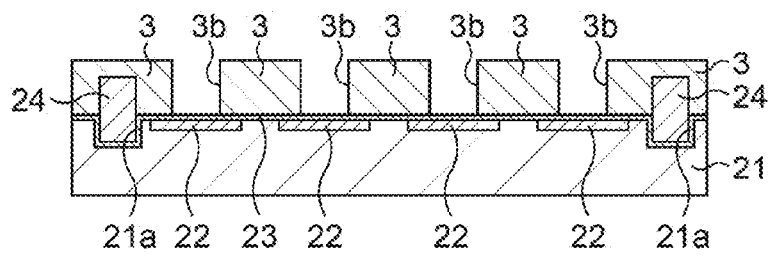

Subsequently, as illustrated in FIG. 5F, openings 3b are formed in the resist 3.

In detail, by processing the resist 3 by lithography, the plural openings 3b from which portions, of the plating seed layer 23, on predetermined connection terminal formation regions on the electrode pads 22 are exposed are formed. The openings 3b are formed in a rectangular shape wider than the openings 3a of the resist 3 which are formed at the time when the semiconductor chip 10 is formed.

Figure 6A:
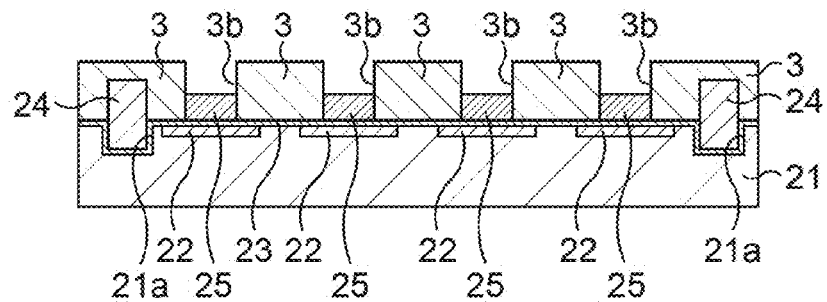
FIG. 6A to FIG. 6D, which continue from FIG. 5F, are schematic cross-sectional views illustrating the manufacturing method of the circuit board which is the constituent element of the semiconductor device according to the first embodiment, in order of processes.

Subsequently, as illustrated in FIG. 6A, second terminals 25 are formed on the electrode pads 22.

In detail, by an electrolytic plating method, Cu is deposited on the portions, of the plating seed layer 23, which are on the electrode pads 22 and are exposed from bottom portions of the openings 3b, so as to partly fill the openings 3b of the resist 3. Consequently, the block-shaped second terminals 25 are formed on the electrode pads 22.

Figure 6B:
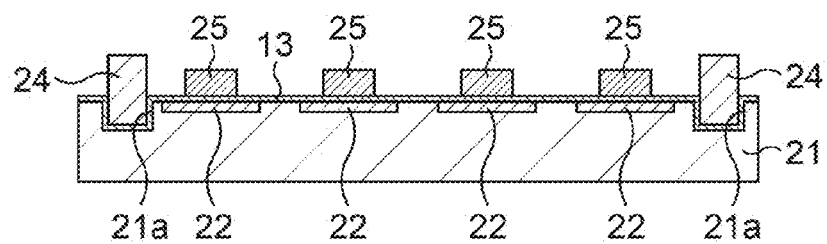

Subsequently, as illustrated in FIG. 6B, the resist 3 is removed by ashing using oxygen plasma or by wet etching using a predetermined chemical solution.

Figure 6C:
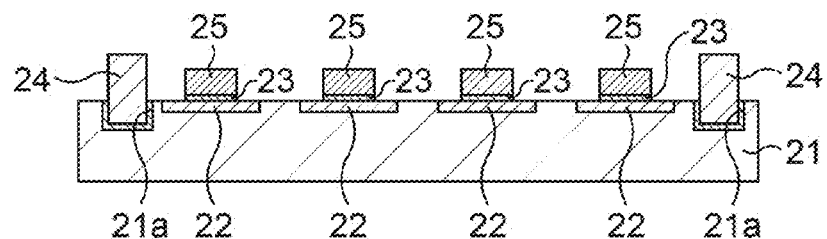

Subsequently, as illustrated in FIG. 6C, exposed portions of the plating seed layer 23 are removed.

In detail, unnecessary portions exposed between the second terminals 25, of the plating seed layer 23, are removed by wet etching.

Figure 6D:
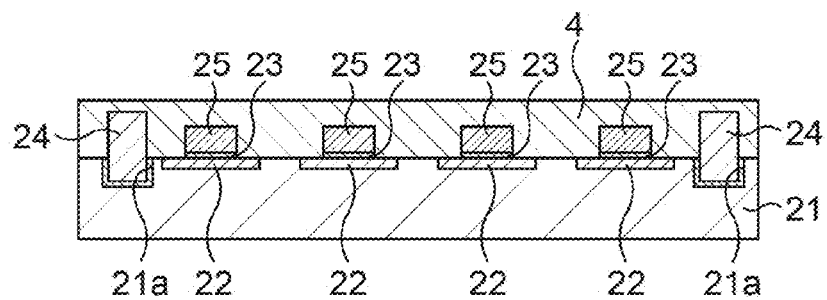

Subsequently, as illustrated in FIG. 6D, a resist 4 is formed on the package substrate 21.

In detail, the resist 4 is applied and formed on the package substrate 21 so as to have a thickness large enough to bury the stoppers 24 and the second terminals 25.

Figure 7A:
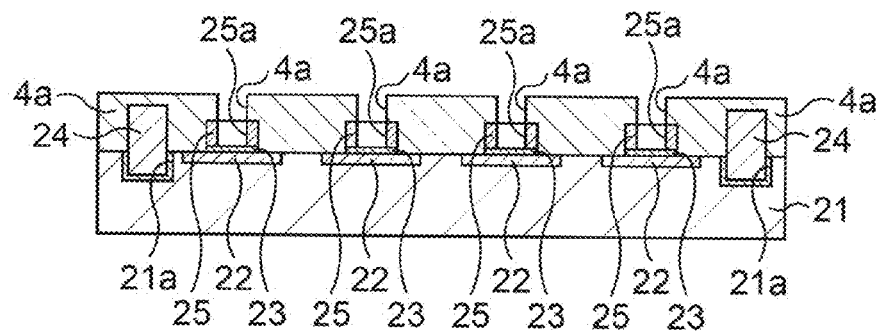
FIG. 7A to FIG. 7C, which continue from FIG. 6D, are schematic cross-sectional views illustrating the manufacturing method of the circuit board which is the constituent element of the semiconductor device according to the first embodiment, in order of processes.

Subsequently, as illustrated in FIG. 7A, recesses 25a are formed in one side surfaces of the second terminals 25.

First, by processing the resist 4 by lithography, a plurality of openings 4a from which parts of upper surfaces of the second terminals 25 (parts including end portions of the one side surfaces in the upper surfaces) are exposed are formed.

Next, the portions, of the second terminals 25, which are exposed from the openings 4a are dry-etched by using the resist 4 as a mask. Consequently, the recesses 25a are formed on the one side surfaces of the second terminals 25. As a result of forming the recesses 25a, horizontal sections of the second terminals 25 have a substantially C shape. The recesses 25a correspond to the first terminals 15 of the semiconductor chip 10, and are regions in which the first terminals 15 are fit as will be described later.

Figure 7B:
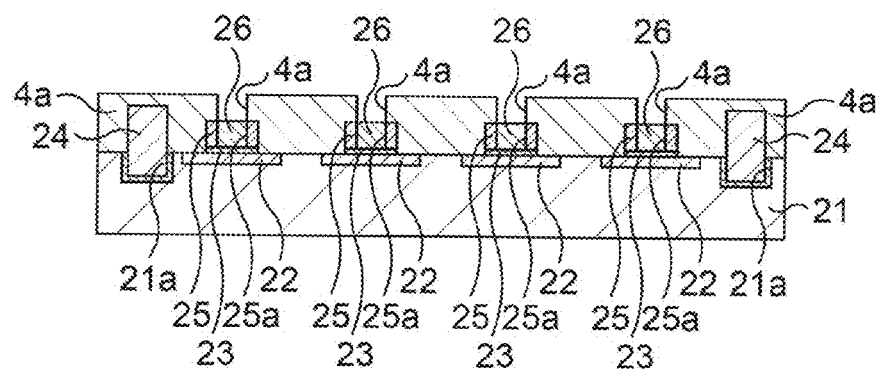

Subsequently, as illustrated in FIG. 7B, solders 26 are filled in the recesses 25a of the second terminals 25.

In detail, by an electroless plating method, the solders 26 are formed from the openings 4a of the resist 4 so as to fill the recesses 25a formed in the second terminals 25 by the aforesaid dry etching.

Figure 7C:
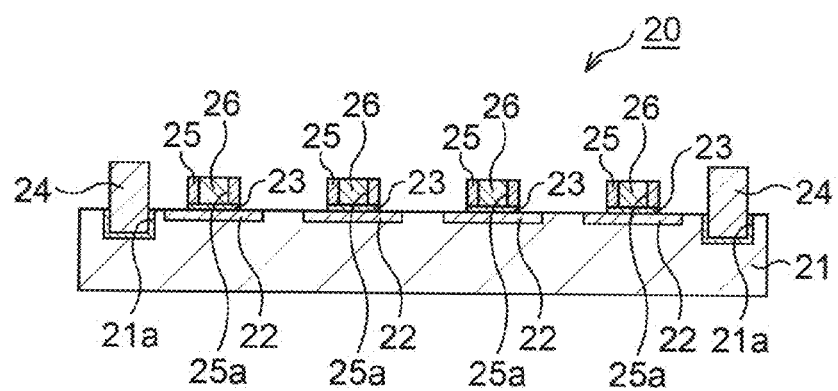

Subsequently, as illustrated in FIG. 7C, the resist 4 is removed by ashing using oxygen plasma or by wet etching using a predetermined chemical solution.

Through the above processes, the circuit board 20 is formed.

Figure 8:
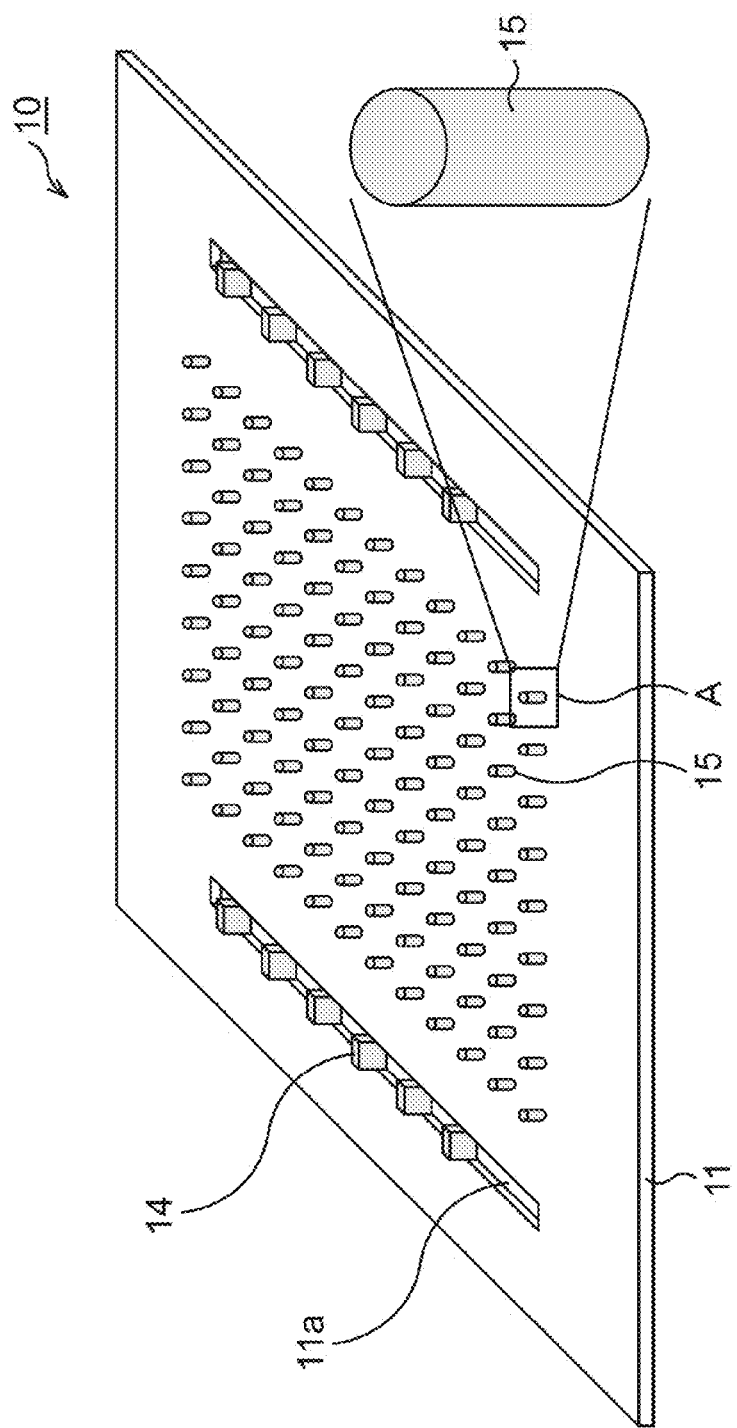
FIG. 8 is a schematic perspective view illustrating the semiconductor chip fabricated by the first embodiment.
Figure 9:
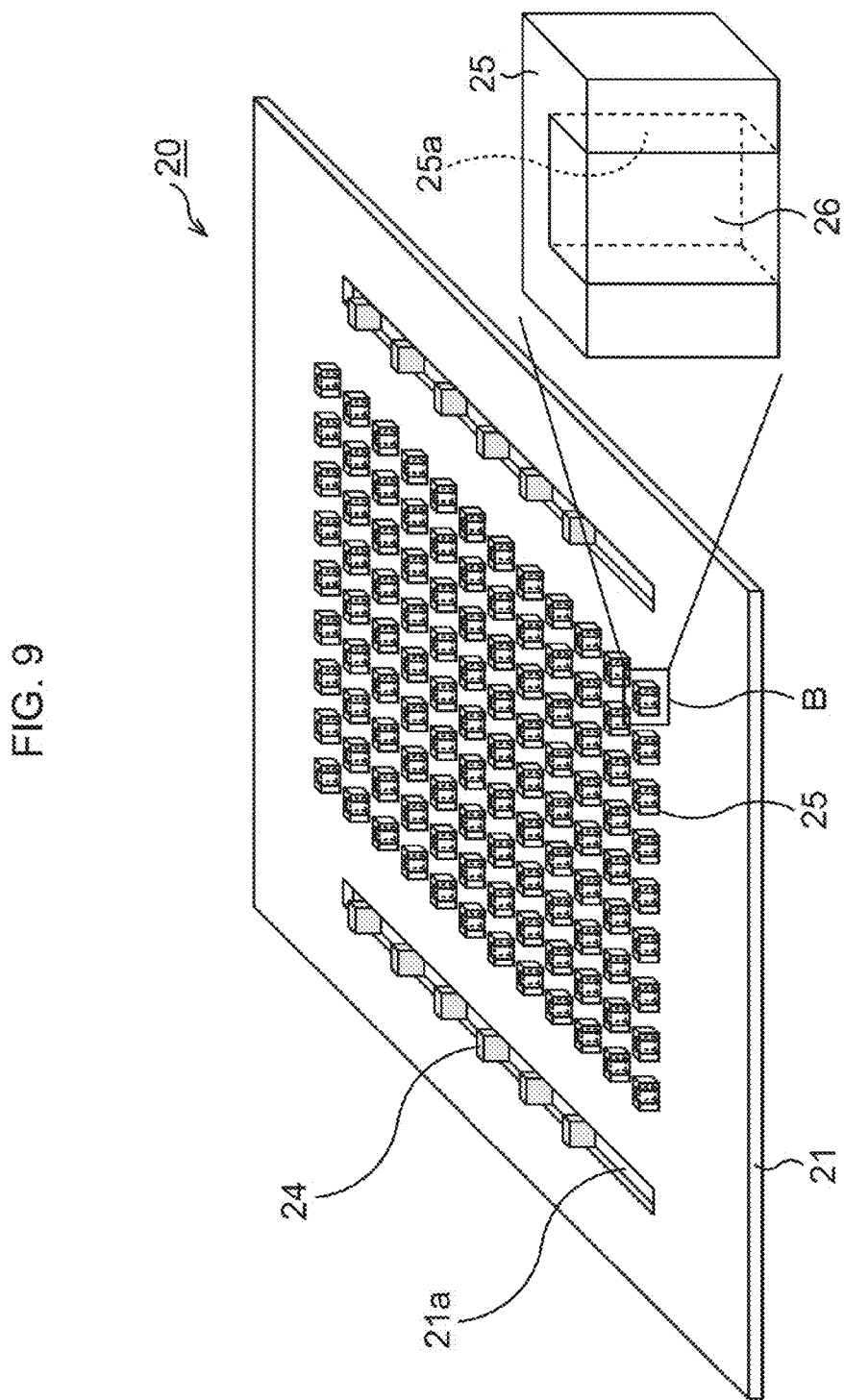
FIG. 9 is a schematic perspective view illustrating the circuit board fabricated by the first embodiment.

The semiconductor chip 10 and the circuit board 20 which are formed as above are illustrated in FIG. 8 and FIG. 9 respectively.

On the surface of the semiconductor chip 10, the plural first terminals 15 are formed to be arranged in a matrix form, and in its both end portions, the rail grooves 11a in which the stoppers 14 are disposed at equal intervals are formed so as to sandwich the plural first terminals 15. One first terminal 15 surrounded by the rectangle A is illustrated in an enlarged manner.

On the surface of the circuit board 20, the plural second terminals 25 are formed to be arranged in a matrix form, and in its both end portions, the rail grooves 21a in which the stoppers 24 are disposed at equal intervals are formed so as to sandwich the plural second terminals 25. One second terminal 25 surrounded by the rectangle B (including the solder 26 filling the recess 25a) is illustrated in an enlarged manner.

[Joining of Semiconductor Chip and Circuit Board]

Thereafter, the semiconductor chip 10 and the circuit board 20 which are formed as above are joined.

FIG. 10A to FIG. 10D are schematic cross-sectional views illustrating how the semiconductor chip and the circuit board are joined, in order of processes.

Figure 10A:
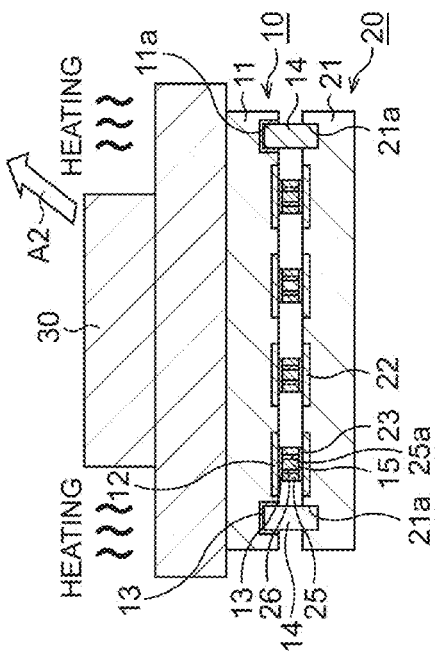
FIG. 10A to FIG. 10D are schematic cross-sectional views illustrating how the semiconductor chip and the circuit board are joined in the first embodiment, in order of processes.

First, as illustrated in FIG. 10A, the semiconductor chip 10 and the circuit board 20 are disposed so that their surfaces face each other.

Figure 11A:
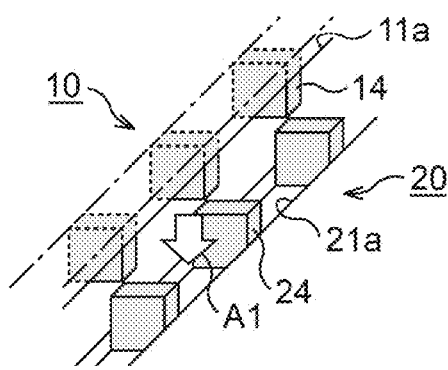
FIG. 11A to FIG. 11D are enlarged schematic views illustrating states of constituent members in FIG. 10A.
Figure 11B:
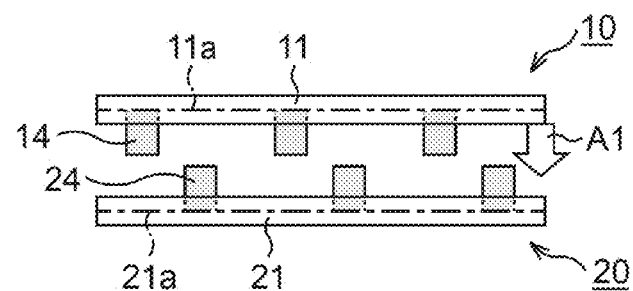
Figure 11C:
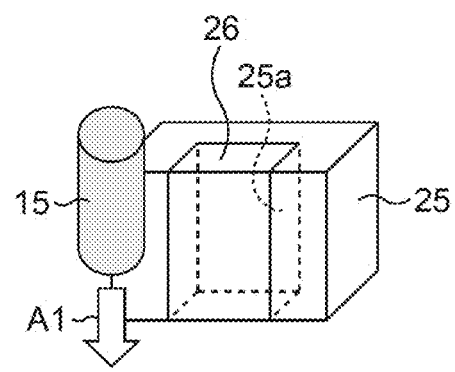
Figure 11D:
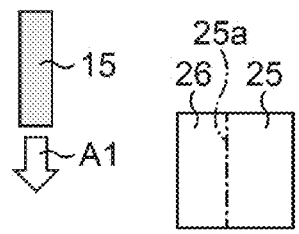

States of the constituent members at this time are illustrated in FIG. 11A to FIG. 11D in an enlarged manner. FIG. 11A is a perspective view of the vicinity of the rail grooves 11a, 21a, FIG. 11B is a side view of the same, FIG. 11C is a perspective view of the vicinity of the first and second terminals 15, 25, and FIG. 11D is a side view of the same.

The semiconductor chip 10 and the circuit board 20 are placed on a flip chip bonder. Concretely, the semiconductor chip 10 is fixed on a head attachment 30 and the circuit board 20 is fixed on a not-illustrated stage. The semiconductor chip 10 and the circuit board 20 are disposed so that their surfaces face each other, concretely, so that the rail grooves 11a of the semiconductor chip 10 and the rail grooves 21a of the circuit board 20 are aligned with each other. By disposing them so that the rail grooves 11a, 21a are aligned with each other as illustrated in FIG. 11A and FIG. 11B, the corresponding first and second terminals 15, 25 are disposed close to each other as illustrated in FIG. 11C and FIG. 11D. In this state, the semiconductor chip 10 is moved in the direction of the arrow A1 in FIG. 11A to FIG. 11D so that the surface of the semiconductor chip 10 and the surface of the circuit board 20 approach each other.

Figure 10B:
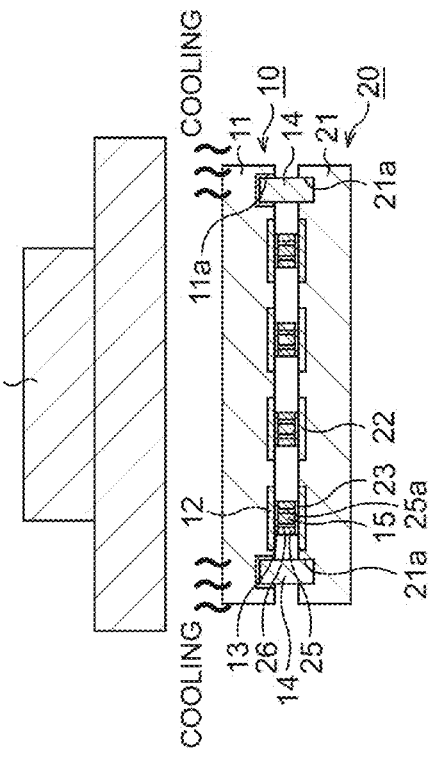

Subsequently, as illustrated in FIG. 10B, the upper portions of the stoppers 24 of the circuit board 20 are fit into the rail grooves 11a of the semiconductor chip 10, and the upper portions of the stoppers 14 of the semiconductor chip 10 are fit into the rail grooves 21a of the circuit board 20.

Figure 12A:
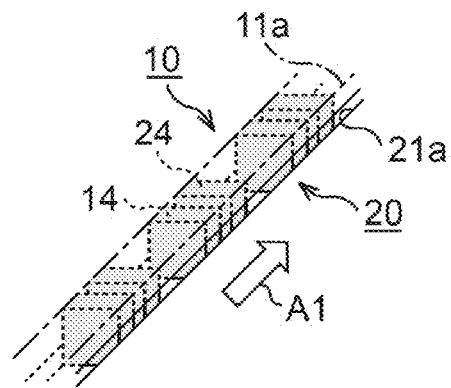
FIG. 12A to FIG. 12D are enlarged schematic views illustrating states of the constituent members in FIG. 10B.
Figure 12B:
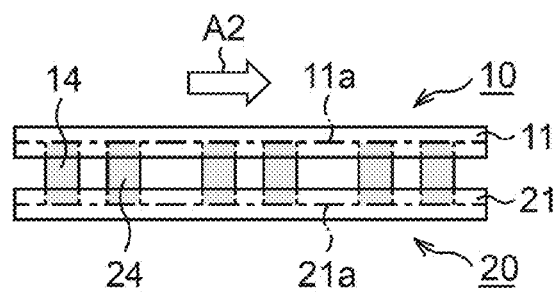
Figure 12C:
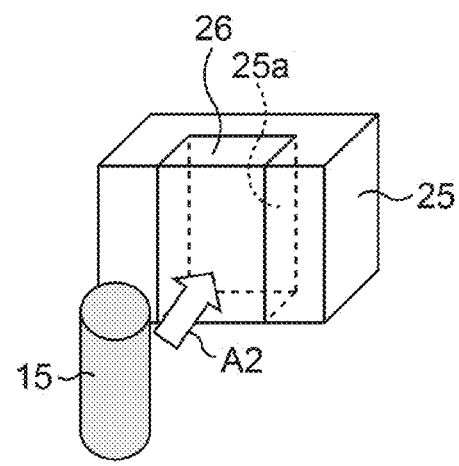

States of the constituent members at this time are illustrated in FIG. 12A to FIG. 12D in an enlarged manner. FIG. 12A is a perspective view of the vicinity of the rail grooves 11a, 21a, FIG. 12B is a side view of the same, FIG. 12C is a perspective view of the vicinity of the first and second terminals 15, 25, and FIG. 12B is a side view of the same.

Figure 12D:
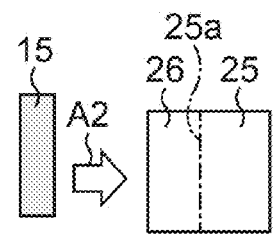

The semiconductor chip 10 is pressed with a set load of, for example, about 0.5 N to about 5N, whereby the surface of the semiconductor chip 10 is moved in the vertical direction, namely, in the direction of the arrows A1 in FIG. 10B toward the surface of the circuit board 20. By this pressing, the upper portions of the stoppers 24 of the circuit board 20 are fit into regions between the adjacent stoppers 14 of the rail grooves 11a of the semiconductor chip 10. Along with this, the upper portions of the stoppers 14 of the semiconductor chip 10 are fit into regions between the adjacent stoppers 24 of the rail grooves 21a of the circuit board 20. At this time, the first terminals 15 and the solders 26 of the corresponding second terminals 25 face each other in alignment as illustrated in FIG. 12C and FIG. 12D. In this state, the corresponding first and second terminals 15, 25 are deviated from each other in the horizontal direction. In this state, the surface of the semiconductor chip 10 and the surface of the circuit board 20 are moved in parallel in the direction of the arrow A2 in FIG. 12A to FIG. 12C.

Figure 10C:
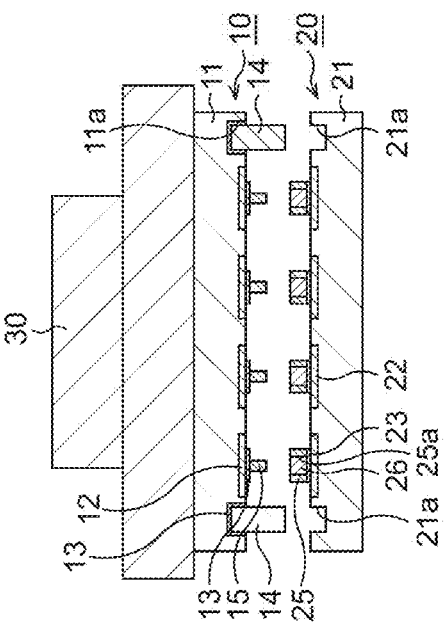

Subsequently, as illustrated in FIG. 10C, the stoppers 14, 24 are brought into contact with each other.

Figure 13A:
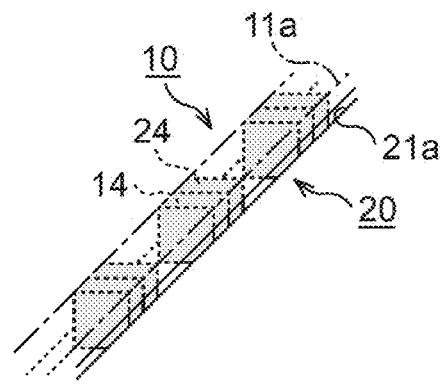
FIG. 13A to FIG. 13D are enlarged schematic views illustrating states of the constituent members in FIG. 10C.
Figure 13B:
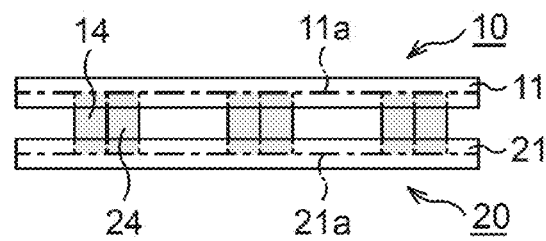
Figure 13C:
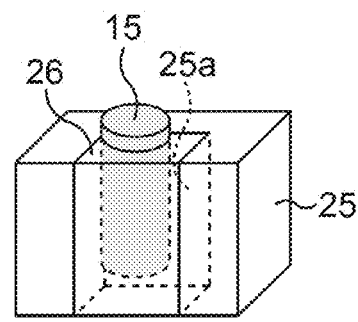
Figure 13D:
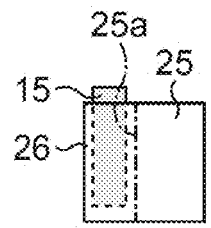

States of the constituent members at this time are illustrated in FIG. 13A to FIG. 13D in an enlarged manner. FIG. 13A is a perspective view of the vicinity of the rail grooves 11a, 21a, FIG. 13B is a side view of the same, FIG. 13C is a perspective view of the vicinity of the first and second terminals 15, 25, and FIG. 13D is a side view of the same.

The head attachment 30 is set to a predetermined temperature that is equal to or higher than a melting temperature of the solders 26, for example, to about 300° C. While the semiconductor chip 10 is heated to about 300° C., the surface of the semiconductor chip 10 is moved (slid) in the direction of the arrow A2 in FIG. 10C in parallel to the surface of the circuit board 20 until the stoppers 14, 24 abut on each other to come into contact with each other. At this time, as illustrated in FIG. 13C and FIG. 13D, the first terminals 15 are fit into the recesses 25a of the second terminals 25 via the solders 26 melted by the heating.

Figure 10D:
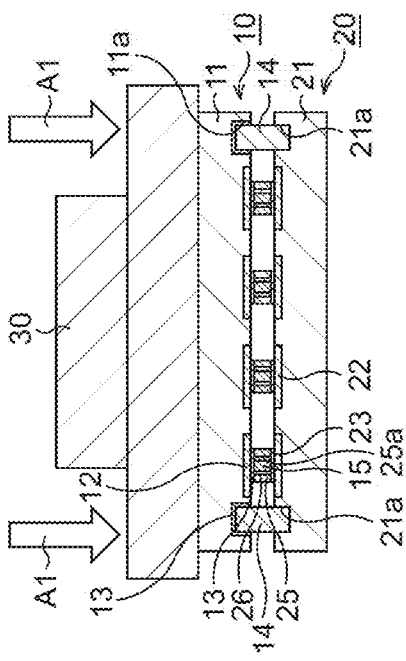

Subsequently, as illustrated in FIG. 10D, the solders 26 are coagulated by cooling. By the coagulated solders 26, the first terminals 15 are electrically connected to the second terminals 25, and the semiconductor chip 10 and the circuit board 20 are joined.

Thereafter, the semiconductor chip 10 and the circuit board 20 are removed from the flip chip bonder, and through various processes such as sealing using sealing resin, the semiconductor device is fabricated.

FIG. 14A to FIG. 14D illustrate an example of the first and second terminals 15, 25 in this embodiment.

Figure 14A:
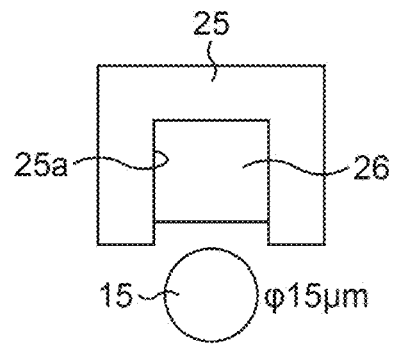
FIG. 14A to FIG. 14C are schematic views illustrating an example of first and second terminals in the first embodiment.
Figure 14B:
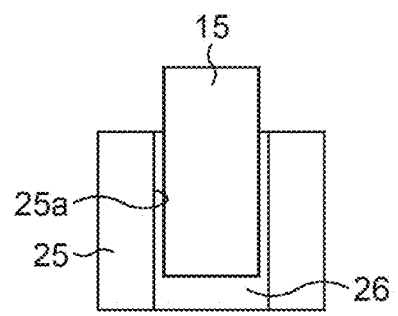
Figure 14C:
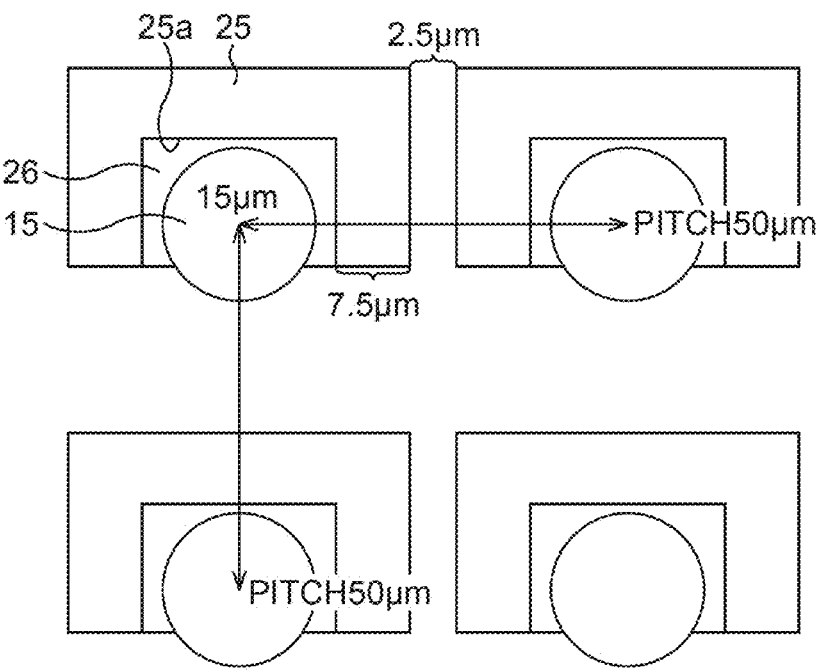

As illustrated in FIG. 14A, the first terminals 15 each have an about 15 μm diameter, and as illustrated in FIG. 14B, the first terminals 15 are fit and fixed in the recesses 25a of the second terminals 25 via the solders 26. As illustrated in FIG. 14C, each of the second terminals 25 has an about 7.5 μm thickness at a tip portion of the C-shape and is about 2.5 μm apart from the adjacent second terminal 25, and the second terminals 25 are arranged in a line at an about 50 μm pitch.

Figure 15B:
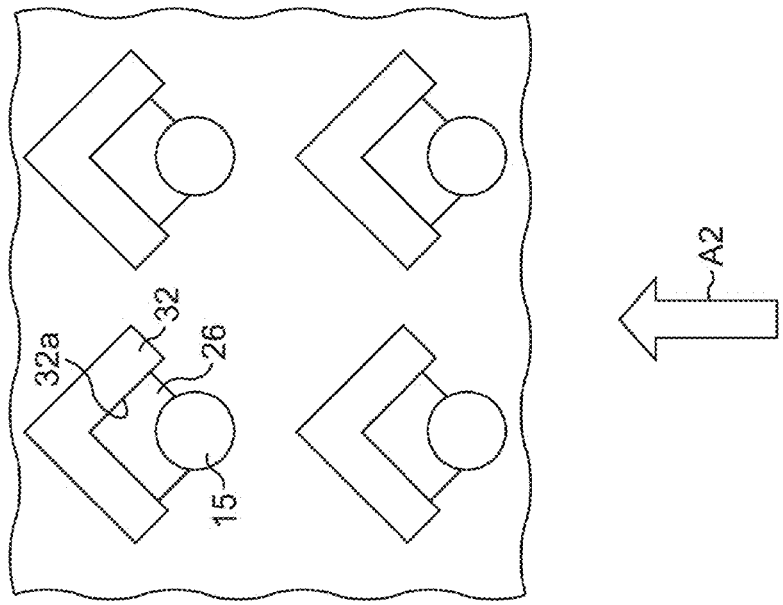
FIG. 15A to FIG. 15C are schematic views illustrating examples of other forms of the second terminals in the first embodiment.
Figure 15A:
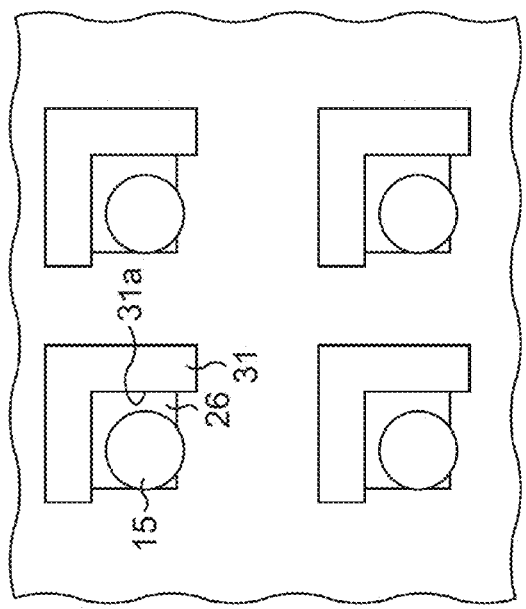
Figure 15C:
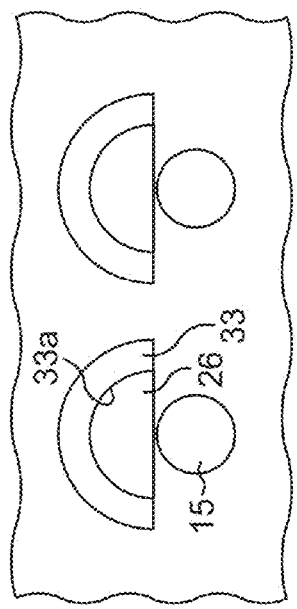

FIG. 15A to FIG. 15C illustrate other forms of the second terminals in this embodiment.

In FIG. 15A, second terminals 31 have recesses 31a in their side surfaces so as to have a substantially L-shaped horizontal section, and the solders 26 are applied so as to fill the recesses 31a. The first terminals 15 are fit and fixed in the recesses 31a of the second terminals 31 via the solders 26.

In FIG. 15B, second terminals 32 have recesses 32a in their side surfaces so as to have a substantially inverted V-shaped horizontal section and the solders 26 are applied so as to fill the recesses 32a. The first terminals 15 are fit and fixed in the recesses 32a of the second terminals 32 via the solders 26.

In FIG. 15C, second terminals 33 have recesses 33a in their side surfaces so as to have a substantially semicircular arc-shaped horizontal sections and the solders 26 are applied so as fill the recesses 33a. The first terminals 15 are fit and fixed in the recesses 33a of the second terminals 33 via the solders 26.

In this embodiment, by using the stoppers 14, 24 in the rail grooves 11a, 21a at the time of joining the semiconductor chip 10 and the circuit board 20, it is possible to prevent the misalignment of the semiconductor chip 10 and the circuit board 20. Consequently, it is possible to join the semiconductor chip 10 and the circuit board 20 easily and surely in a predetermined state.

At the time of joining the semiconductor chip 10 and the circuit board 20, the first terminals 15 and the second terminals 25 are electrically connected at their side surfaces via the solders 26. Therefore, as compared with a case where upper surfaces of corresponding terminals are connected to each other, a contact area between the first and second terminals 15, 25 are far larger and a permissible range of the misalignment in the electrical connection between the first and second terminals 15, 25 is large. Accordingly, even when slight misalignment in the vertical direction and the horizontal direction occurs between the first and second terminals 15, 25 at the time of the joining, sufficient electrical connection is ensured. Further, even when a warp occurs in the semiconductor chip 10, the large contact area between the first and second terminals 15, 25 ensures the electrical connection between the first and second terminals 15, 25 not only on an outer peripheral portion of the semiconductor chip 10 but also on its center portion.

In this embodiment, the stoppers 14, 24 have a function of preventing the misalignment at the time of joining the semiconductor chip 10 and the circuit board 20. In this case, the stoppers 14, 24 may have a function as connection terminals in addition to the misalignment preventing function. As an example, the stoppers 14 are formed in the same shape as the shape of the first terminals 15 and are connected to the electrode pads 12 thereunder, and the stoppers 24 are formed in the same shape and with the same structure as those of the second terminals 25 and are connected to the electrode pads 22 thereunder. Then, by the stoppers 14, 24 abutting on each other to come into contact with each other, the stoppers 14, 24 are electrically connected via the solders 26 in the same manner as in the connection between the first and second terminals 15, 25.

As described above, according to this embodiment, a highly reliable semiconductor device is realized in which the permissible range of the misalignment occurring when the corresponding first and second terminals 15, 25 are electrically connected to each other is large, and the sure electrical connection is obtained between the first and second terminals 15, 25 even when slight misalignment occurs.

Second Embodiment

Next, a second embodiment will be described. This embodiment, similarly to the first embodiment, discloses a semiconductor device in which a semiconductor chip and a circuit board are joined, but is different from the first embodiment in that a positioning structure at the time of joining the both is slightly different.

[Fabrication of Semiconductor Chip]

In fabricating the semiconductor device according this embodiment, the semiconductor chip being a constituent element of the semiconductor device is first formed.

FIG. 16A to FIG. 16F are schematic cross-sectional views illustrating a manufacturing method of the semiconductor chip being the constituent element of the semiconductor device according to the second embodiment, in order of processes.

To fabricate the semiconductor chip, electrode pads 12 are first formed on a surface of a semiconductor substrate 11 as in FIG. 1A of the first embodiment.

Figure 16A:
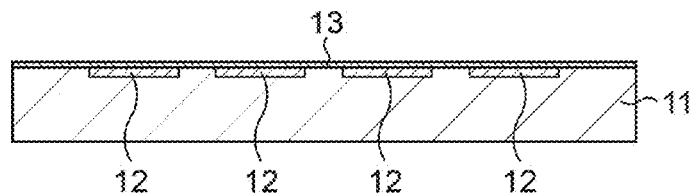
FIG. 16A to FIG. 16F are schematic cross-sectional views illustrating a manufacturing method of a semiconductor chip which is a constituent element of a semiconductor device according to a second embodiment, in order of processes.

Subsequently, as illustrated in FIG. 16A, a plating seed layer 13 is formed on the surface of the semiconductor substrate 11.

In detail, on the surface of the semiconductor substrate 11, Ti/Cu (Ti is a lower layer and Cu is an upper layer) are thinly deposited by, for example, a sputtering method. Consequently, the plating seed layer 13 which serves as a seed of Cu plating is formed.

Figure 16B:
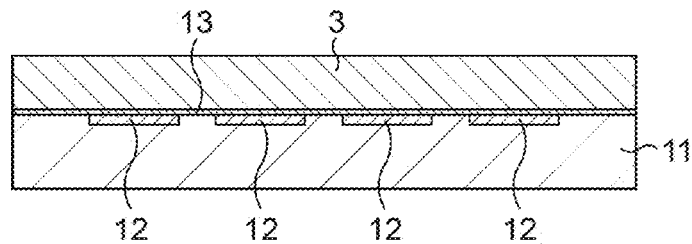

Subsequently, as illustrated in FIG. 16B, a resist 3 is formed on the semiconductor substrate 11.

In detail, the resist 3 is applied and formed so as cover a surface of the plating seed layer 13 on the semiconductor substrate 11.

Figure 16C:
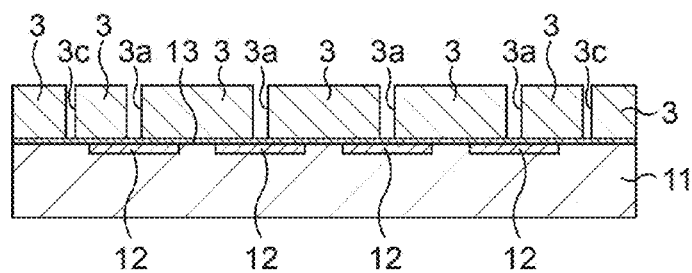

Subsequently, as illustrated in FIG. 16C, openings 3a, 3c are formed in the resist 3.

In detail, by processing the resist 3 by lithography, the plural hole-shaped openings 3a from which portions, of the plating seed layer 13, on predetermined connection terminal formation regions on the electrode pads 12 are exposed are formed, and the pair of openings 3c from which portions, of the plating seed layer 13, on predetermined stopper formation regions are exposed are formed.

Figure 16D:
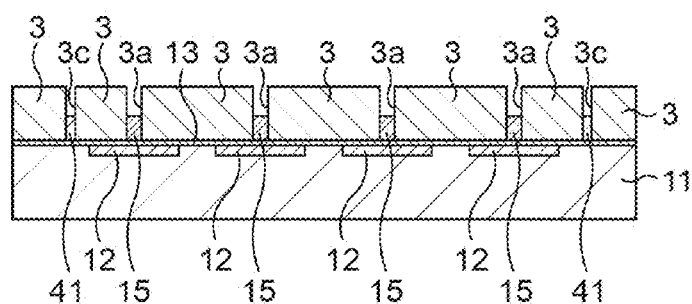

Subsequently, as illustrated in FIG. 16D, first terminals 15 are formed on the electrode pads 12, and stoppers 41 are formed on the both end regions of the surface of the semiconductor substrate 11.

In detail, by an electrolytic plating method, Cu is deposited on the portions, of the plating seed layer 13, which are on the electrode pads 12 and on the semiconductor substrate 11 and exposed from bottom portions of the openings 3a, 3c, so as to partly fill the openings 3a, 3c of the resist 3. Consequently, the pillar-shaped first terminals 15 are formed on the electrode pads 12, and the stoppers 41 are formed on the both end regions of the surface of the semiconductor substrate 11. The stoppers 41 are formed in a block shape on the end regions of the surface of the semiconductor substrate 11 and are arranged in a line in a longitudinal direction at equal intervals.

Figure 16E:
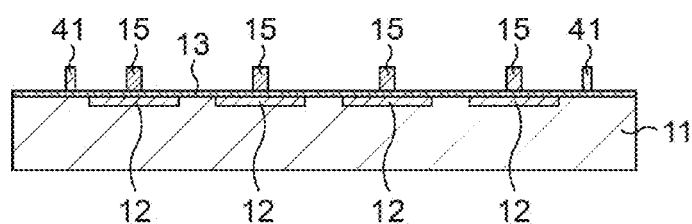

Subsequently, as illustrated in FIG. 16E, the resist 3 is removed by ashing using oxygen plasma or by wet etching using a predetermined chemical solution.

Figure 16F:
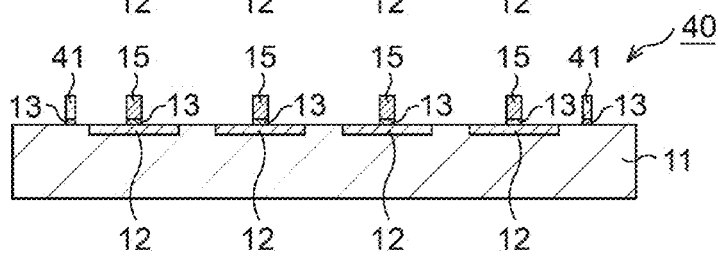

Subsequently, as illustrated in FIG. 16F, exposed portions of the plating seed layer 13 are removed.

In detail, unnecessary portions, of the plating seed layer 13, which are exposed between the first terminals 15 and between the first terminals 15 and the stoppers 41 are removed by wet etching.

Through the above processes, the semiconductor chip 40 is formed.

[Fabrication of Circuit Board]

The circuit board being a constituent element of the semiconductor device is formed.

FIG. 17A to FIG. 18D are schematic cross-sectional views illustrating a manufacturing method of the circuit board being the constituent element of the semiconductor device according to the second embodiment, in order of processes.

To fabricate the circuit board, electrode pads 22 are first formed on a surface of a package substrate 21 as in FIG. 4A of the first embodiment.

Figure 17A:
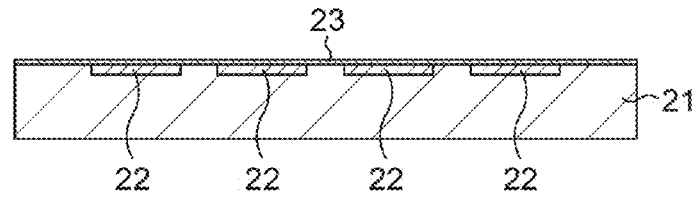
FIG. 17A to FIG. 17F are schematic cross-sectional views illustrating a manufacturing method of a circuit board which is a constituent element of the semiconductor device according to the second embodiment, in order of processes.

Subsequently, as illustrated in FIG. 17A, a plating seed layer 23 is formed on the surface of the package substrate 21.

In detail, on the surface of the package substrate 21, Ti/Cu (Ti is a lower layer and Cu is an upper layer) are thinly deposited by, for example, a sputtering method. Consequently, the plating seed layer 23 which serves as a seed of Cu plating is formed.

Figure 17B:
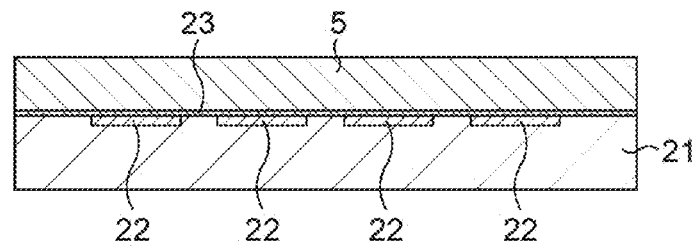

Subsequently, as illustrated in FIG. 17B, a resist 5 is formed on the package substrate 21.

In detail, the resist 5 is applied and formed so as cover a surface of the plating seed layer 23 on the package substrate 21.

Figure 17C:
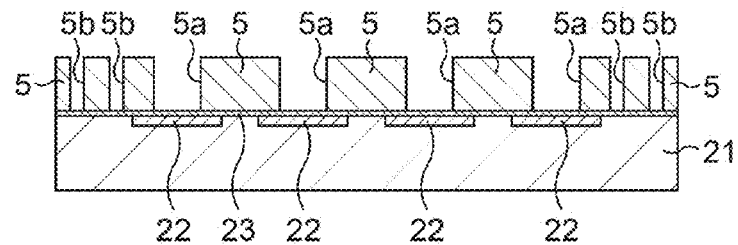

Subsequently, as illustrated in FIG. 17C, openings 5a, 5b and not-illustrated openings are formed in the resist 5.

In detail, the resist 5 is processed by lithography. Consequently, in the resist 5, the plural rectangular openings 5a from which portions, of the plating seed layer 23, on predetermined connection terminal formation regions on the electrode pads 22 are exposed are formed, and the openings 5b from which portions, of the plating seed layer 23, on predetermined wall portion formation regions are exposed are formed. In addition, the not-illustrated openings from which portions, of the plating seed layer 23, on predetermined stopper formation regions each in a region between a pair of wall portions are exposed are formed in the resist 5. The openings 5a are formed in the rectangular shape wider than the openings 3a of the resist 3 which are formed at the time when the semiconductor chip 10 is formed. A distance between the openings 5b is wider than the stopper 41 of the semiconductor chip 10. The not-illustrated openings are each formed with substantially the same width as that of the stopper 41.

Figure 17D:
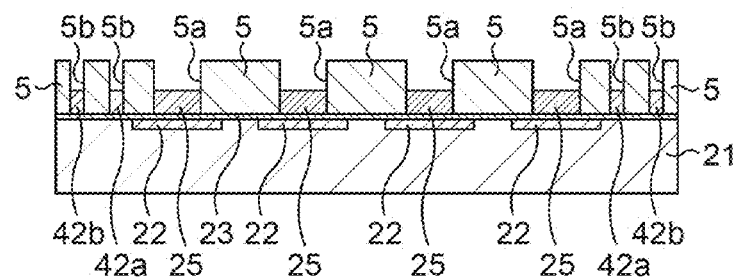

Subsequently, as illustrated in FIG. 17D, second terminals 25 are formed on the electrode pads 22, and not-illustrated stoppers are formed on the both end regions of the surface of the package substrate 21.

In detail, by an electrolytic plating method, Cu is deposited on the portions, of the plating seed layer 23, which are on the electrode pads 22 and on the semiconductor substrate 21 and are exposed from bottom portions of the openings 5a, 5c and the not-illustrated openings, so as to partly fill the openings 5a, 5b and the not-illustrated openings of the resist 5. Consequently, the block-shaped second terminals 25 are formed on the electrode pads 22, the pairs of wall portions 42a, 42b are formed along sides of the both end regions of the package substrate 21, and the not-illustrated stoppers are formed on the regions between the wall portions 42a, 42b. In the region between the pair of the wall portions 42a, 42b on each of the ends of the surface of the package substrate 21, the stoppers are formed in the block shape and are arranged in a line at, for example, equal intervals along a longitudinal direction of the wall portions 42a, 42b.

Figure 17E:
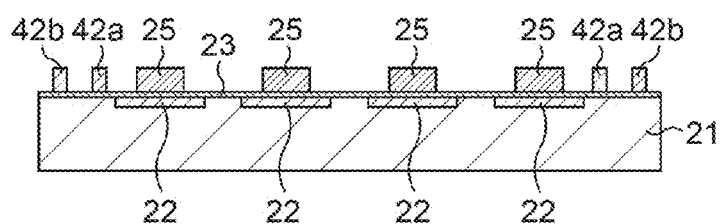

Subsequently, as illustrated in FIG. 17E, the resist 5 is removed by ashing using oxygen plasma or by wet etching using a predetermined chemical solution.

Figure 17F:
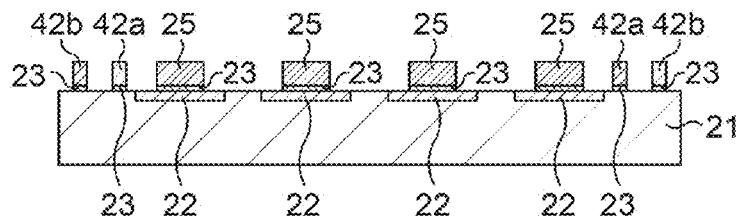

Subsequently, as illustrated in FIG. 17F, exposed portions of the plating seed layer 23 are removed.

In detail, unnecessary portions exposed between the second terminals 25, between the wall portions 42a, 42b, and between the wall portions 42a, 42b and the not-illustrated stoppers, of the plating seed layer 23 are removed by wet etching.

Figure 18A:
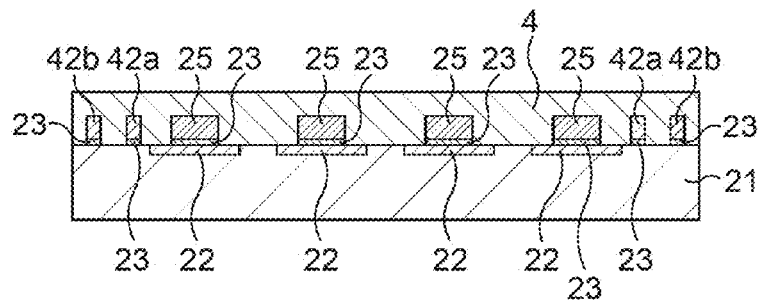
FIG. 18A to FIG. 18D, which continue from FIG. 17F, are schematic cross-sectional views illustrating the manufacturing method of the circuit board which is the constituent element of the semiconductor device according to the second embodiment, in order of processes.

Subsequently, as illustrated in FIG. 18A, a resist 4 is formed on the package substrate 21.

In detail, the resist 4 is applied and formed on the package substrate 21 so as to have a thickness large enough to bury the second terminals 25, the wall portions 42a, 42b, and the not-illustrate stoppers.

Figure 18B:
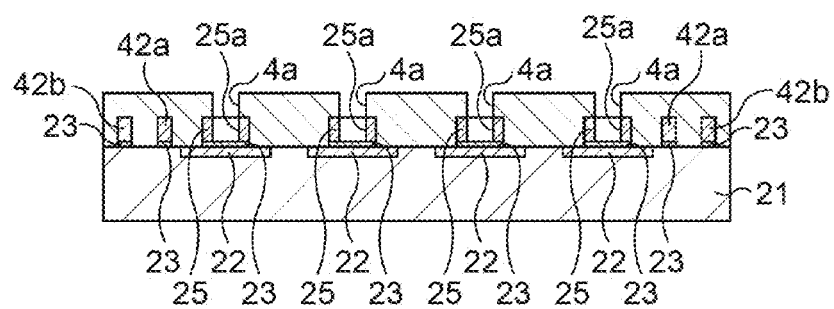

Subsequently, as illustrated in FIG. 18B, recesses 25a are formed in one side surfaces of the second terminals 25.

First, by processing the resist 4 by lithography, a plurality of openings 4a from which parts of upper surfaces of the second terminals 25 (parts including end portions of the one side surfaces in the upper surfaces) are exposed are formed.

Next, the portions, of the second terminals 25, which are exposed from the openings 4a are dry-etched by using the resist 4 as a mask. Consequently, the recesses 25a are formed in the one side surfaces of the second terminals 25. As a result of forming the recesses 25a, horizontal sections of the second terminals 25 have a substantially C shape. The recesses 25a correspond to the first terminals 15 of the semiconductor chip 10, and are regions in which the first terminals 15 are fit as will be described later.

Figure 18C:
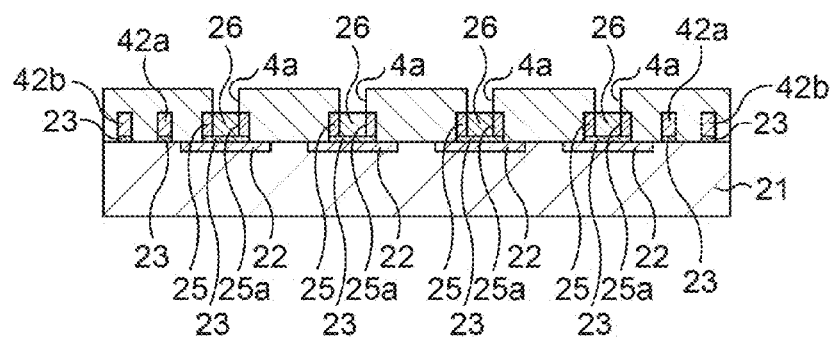

Subsequently, as illustrated in FIG. 18C, solders 26 are filled in the recesses 25a of the second terminals 25.

In detail, by an electroless plating method, the solders 26 are formed from the openings 4a of the resist 4 so as to fill the recesses 25a formed in the second terminals 25 by the aforesaid dry etching.

Figure 18D:
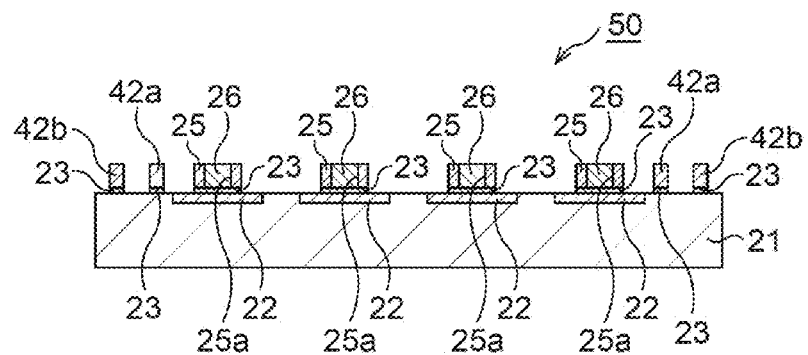

Subsequently, as illustrated in FIG. 18D, the resist 4 is removed by ashing using oxygen plasma or by wet etching using a predetermined chemical solution.

Through the above processes, the circuit board 50 is formed.

[Joining of Semiconductor Chip and Circuit Board]

Thereafter, the semiconductor chip 40 and the circuit board 50 which are formed as above are joined.

First, the semiconductor chip 40 and the circuit board 50 are disposed so that their surfaces face each other.

The semiconductor chip 40 is fixed on a head attachment, and the circuit board 50 is fixed on a stage. The semiconductor chip 40 and the circuit board 50 are disposed so that their surfaces face each other, concretely, so that the stoppers 41 of the semiconductor chip 40 and the regions between the wall portions 42a, 42b of the circuit board 50 are aligned.

Subsequently, the surface of the semiconductor chip 40 and the surface of the circuit board 50 are made to approach each other, and the stoppers 41 of the semiconductor chip 40 are fit into the regions between the wall portions 42a, 42b of the circuit board 50. At this time, the not-illustrated stoppers of the circuit board 50 enter regions between the adjacent stoppers 41 of the semiconductor chip 40. At this time, the first terminals 15 and the solders 26 of the corresponding second terminals 25 face each other in alignment. In this state, the corresponding first and second terminals 15, 25 are positionally deviated from each other in a horizontal direction.

Subsequently, while the semiconductor chip 40 is heated to about 300° C. by the head attachment, the surface of the semiconductor chip 40 is moved (slid) in parallel to the surface of the circuit board 50 until the stoppers 41 and the not-illustrated stoppers abut on each other to come into contact with each other. At this time, the first terminals 15 are fit into the recesses 25a of the second terminals 25 via the solders 26 melted by the heating.

Figure 19:
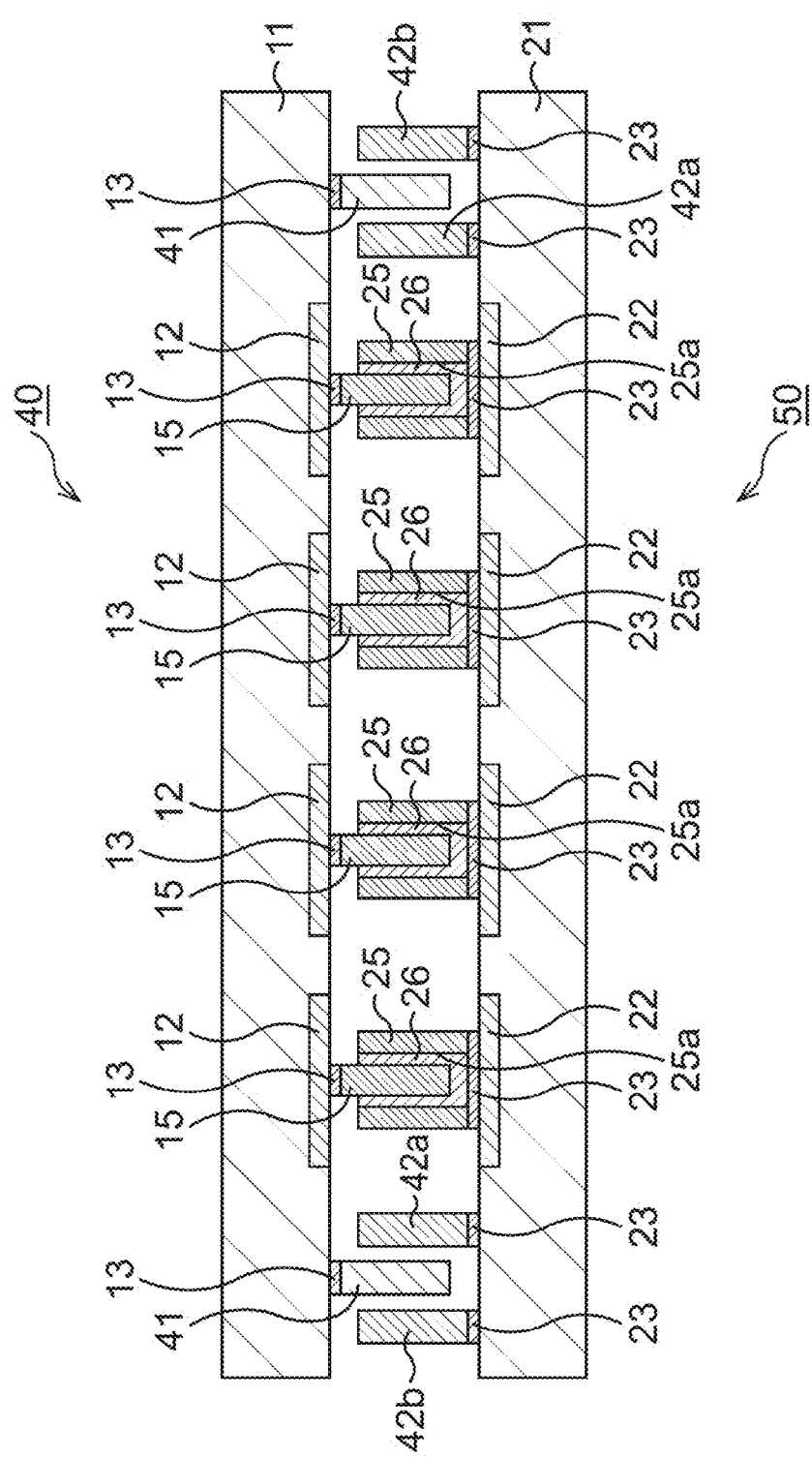
FIG. 19 is a schematic cross-sectional view illustrating a state where the semiconductor chip and the circuit board are joined in the second embodiment.

Subsequently, the solders 26 are coagulated by cooling. As illustrated in FIG. 19, by the coagulated solders 26, the first terminals 15 are electrically connected to the second terminals 25, and the semiconductor chip 40 and the circuit board 50 are joined.

Thereafter, the semiconductor chip 40 and the circuit board 50 are removed from the flip chip bonder, and through various processes such as sealing using sealing resin, the semiconductor device is fabricated.

In this embodiment, regarding the semiconductor chip 40, the first terminals 15 and the stoppers 41 are formed in the simultaneous process, and regarding the circuit board 50, the second terminals 25, the pairs of wall portions 42a, 42b, and the not-illustrated stoppers are formed in the simultaneous process. Therefore, there is no concern about the occurrence of positional error when the first terminals 15 and the stoppers 41 are formed, and there is no concern about the occurrence of positional error when the second terminals 25, the pairs of wall portions 42a, 42b, and the not-illustrated stoppers are formed. Further, since the pairs of wall portions 42a, 42b are formed without the package substrate 21 being etched, the formation thereof is easy.

In this embodiment, by using the stoppers 41 and the stoppers between the wall portions 42a, 42b when the semiconductor chip 40 and the circuit board 50 are joined, it is possible to prevent the misalignment of the semiconductor chip 40 and the circuit board 50. Consequently, it is possible to join the semiconductor chip 40 and the circuit board 50 easily and surely in a predetermined state.

At the time of joining the semiconductor chip 40 and the circuit board 50, the first terminals 15 and the second terminals 25 are electrically connected at their side surfaces via the solders 26. Therefore, as compared with a case where upper surfaces of corresponding terminals are connected to each other, a contact area between the first and second terminals 15, 25 are far larger and a permissible range of the misalignment in the electrical connection between the first and second terminals 15, 25 is large. Accordingly, even when slight misalignment in a vertical direction and a horizontal direction occurs between the first and second terminals 15, 25 at the time of the joining, sufficient electrical connection is ensured. Further, even then a warp occurs in the semiconductor chip 40, the large contact area between the first and second terminals 15, 25 ensures the electrically connection between the first and second terminals 15, 25 not only on an outer peripheral portion of the semiconductor chip 10 but also on its center portion.

As described above, according to this embodiment, a highly reliable semiconductor device is realized in which the permissible range of the misalignment occurring when the corresponding first and second terminals 15, 25 are electrically connected to each other is large, and the sure electrical connection is obtained between the first and second terminals 15, 25 even when slight misalignment occurs.

According to the present invention, a highly reliable semiconductor device is realized in which a permissible range of the misalignment occurring when corresponding terminals are electrically connected to each other is large, and sure electrical connection is obtained between the terminals even when slight misalignment occurs.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first electronic component and a second electronic component at least one of which is a semiconductor element, the first electronic component comprising a first terminal on a surface, and the second electronic component comprising a second terminal on a surface;
   a first positioning member provided on the surface of the first electronic component; and
   a second positioning member provided on the surface of the second electronic component,
   wherein a side surface of the first positioning member is in contact with a side surface of the second positioning member, the surface of the first electronic component and the surface of the second electronic component face each other, and at least part of a side surface of the first terminal and at least part of a side surface of the second terminal are electrically connected.

2. The semiconductor device according to claim 1,
   wherein the first terminal is a projection having a projecting side surface, and the second terminal is a projection having a recessed side surface, and
   wherein at least part of the side surface of the first terminal is fit in a recessed portion of the side surface of the second terminal.

3. The semiconductor device according to claim 1, further comprising
   a groove formed in at least one of the surface of the first electronic component and the surface of the second electronic component,
   wherein one of the first positioning member and the second positioning member is provided in the groove, and
   wherein the other of the first positioning member and the second positioning member is fit in the groove, and the side surface of the first positioning member and the side surface of the second positioning member are in contact with each other.

4. The semiconductor device according to claim 1, further comprising
   a pair of walls formed on at least one of the surface of the first electronic component and the surface of the second electronic component to face each other,
   wherein one of the first positioning member and the second positioning member is provided in a region between the walls, and
   wherein the other of the first positioning member and the second positioning member is fit in the region between the walls, and the side surface of the first positioning member and the side surface of the second positioning member are in contact with each other.

5. The semiconductor device according to claim 1, wherein the first positioning member and the second positioning member are both terminals, and the both are electrically connected.

6. A manufacturing method of a semiconductor device including a first electronic component and a second electronic component at least one of which is a semiconductor element, the method comprising:
   forming a first positioning member on a surface of the first electronic component;
   forming a second positioning member on a surface of the second electronic component; and
   disposing the first electronic component having a first terminal on the surface and the second electronic component having a second terminal on the surface, with the respective surfaces facing each other,
   wherein the first electronic component is relatively moved in parallel to the surface of the second electronic component to bring the side surface of the first positioning member into contact with the side surface of the second positioning member, thereby electrically connecting at least part of a side surface of the first terminal and at least part of a side surface of the second terminal.

7. The manufacturing method of the semiconductor device according to claim 6,
   wherein the first terminal is a projection having a projecting side surface, and the second terminal is a projection having a recessed side surface, and
   wherein at least part of the side surface of the first terminal is fit into a recessed portion of the side surface of the second terminal to electrically connect the first terminal and the second terminal.

8. The manufacturing method of the semiconductor device according to claim 6, further comprising
   forming a groove in at least one of the surface of the first electronic component and the surface of the second electronic component,
   wherein one of the first positioning member and the second positioning member is provided in the groove,
   wherein the other of the first positioning member and the second positioning member is fit into the groove while the first electronic component and the second electronic component are made to face each other, and
   wherein the first electronic component is relatively moved in parallel to the surface of the second electronic component to bring the side surface of the first positioning member and the side surface of the second positioning member into contact with each other.

9. The manufacturing method of the semiconductor device according to claim 6, further comprising
   forming a pair of walls facing each other on at least one of the surface of the first electronic component and the surface of the second electronic component,
   wherein one of the first positioning member and the second positioning member is provided in a region between the walls,
   wherein the other of the first positioning member and the second positioning member is fit into the region between the walls while the first electronic component and the second electronic component are made to face each other, and
   wherein the first electronic component is relatively moved in parallel to the surface of the second electronic component to bring the side surface of the first positioning member and the side surface of the second positioning member into contact with each other.

10. The manufacturing method of the semiconductor device according to claim 6, wherein the first positioning member and the second positioning member are both terminals, and the both are electrically connected.

11. An electronic device comprising:
    an electronic component having, on a surface, a terminal being a projection having a recessed side surface; and
    a positioning member provided on the surface of the electronic component,
    wherein a side surface of the positioning member is in contact with a side surface of a first external terminal being a projection, and electrical connection of the terminal to a second external terminal being a projection having a projecting side surface is obtained by the side surface of the second external terminal being fit in a recessed portion of the side surface of the terminal.

12. The electronic device according to claim 11, further comprising
    a groove formed in the surface of the electronic component,
    wherein the positioning member is provided in the groove.

13. The electronic device according to claim 11, further comprising
    a pair of walls formed on at least one of the surface of the first electronic component and the surface of the second electronic component to face each other, and
    wherein the positioning member is provided in a region between the walls.

* * * * *